United States Patent
Sung et al.

(10) Patent No.: US 7,944,377 B2
(45) Date of Patent: *May 17, 2011

(54) METHOD, MEDIUM AND APPARATUS FOR QUANTIZATION ENCODING AND DE-QUANTIZATION DECODING USING TRELLIS

(75) Inventors: Ho-sang Sung, Yongin-si (KR); Thomas R. Fischer, Pullman, WA (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/556,874

(22) Filed: Sep. 10, 2009

(65) Prior Publication Data

US 2010/0002794 A1    Jan. 7, 2010

Related U.S. Application Data

(63) Continuation of application No. 12/081,597, filed on Apr. 17, 2008, now Pat. No. 7,605,727.

(30) Foreign Application Priority Data

Dec. 27, 2007   (KR) .......................... 10-2007-0138598

(51) Int. Cl.
*H03M 7/30*        (2006.01)
(52) U.S. Cl. ........... 341/107; 341/50; 375/265; 375/341
(58) Field of Classification Search .................... 341/50, 341/51, 67, 107; 375/265, 341; 382/246, 382/247, 251, 253; 714/792, 794, 795
See application file for complete search history.

(56) References Cited

U.S. PATENT DOCUMENTS

| | | | |
|---|---|---|---|
| 5,418,531 A | 5/1995 | Laroia | |
| 6,125,149 A | 9/2000 | Jafarkhani | |
| 6,324,218 B1 | 11/2001 | Jafarkhani | |
| 6,539,122 B1 | 3/2003 | Abousleman | |
| 6,760,481 B1 | 7/2004 | Chebil | |
| 7,295,137 B2 | 11/2007 | Liu | |
| 7,414,549 B1 | 8/2008 | Yang | |
| 7,630,890 B2 * | 12/2009 | Son et al. | 704/230 |
| 2004/0230429 A1 | 11/2004 | Son | |

OTHER PUBLICATIONS

Boo et al., *High Performance VLSI Architecture for the Trellis Coded Quantization*, International Conference on Image Processing 1996, Sep. 1996, vol. 1, pp. 995-998, Lusanne, Switzerland.

Marcellin et al., *Trellis Coded Quantization of Memoryless and Gauss-Markov Sources*, IEEE Transactions on Communications, vol. 38, No. 1, pp. 82-93, Jan. 1990.

Notice of Allowance, mailed Jun. 5, 2009, in the parent U.S. Appl. No. 12/081,597 (6 pp.).

* cited by examiner

*Primary Examiner* — Howard Williams
(74) *Attorney, Agent, or Firm* — Staas & Halsey LLP

(57) ABSTRACT

Provided are a method and apparatus for quantization encoding and de-quantization decoding using a trellis. Unlike a trellis coded quantization (TCQ) index, by classifying quantization levels to which cosets are allocated and allocating indexes to the quantization levels so that a coset corresponding to a specific branch in a predetermined state in the trellis can be selected with only indexes without encoding or decoding information on paths, quantization encoding and de-quantization decoding are performed by using a new index.

16 Claims, 10 Drawing Sheets

METHOD, MEDIUM AND APPARATUS FOR QUANTIZATION ENCODING AND DE-QUANTIZATION DECODING USING TRELLIS

CROSS-REFERENCE TO RELATED APPLICATION

This application is a Continuation of prior U.S. application Ser. No. 12/081,597, filed Apr. 17, 2008 now U.S. Pat. No 7,605,727, the disclosure of which is incorporated herein in its entirety by reference. This application claims the benefit of Korean Patent Application No. 10-2007-0138598, filed on Dec. 27, 2007, in the Korean Intellectual Property Office, the disclosure of which is incorporated herein in its entirety by reference.

BACKGROUND

1. Field

One or more embodiments of the present invention relates to quantization encoding and de-quantization decoding, and more particularly, to a method, medium and apparatus for quantization and de-quantization using a trellis.

2. Description of the Related Art

Trellis quantization coding is a type of vector quantization methods, in which a vector codebook required for encoding is composed of a scalar codebook corresponding to each element forming a vector, a trellis structure is represented by using a convolution coder, and a trellis path for optimal encoding is searched for using a Viterbi algorithm. A trellis quantization coding scheme has much lower complexity than unstructured vector quantization.

SUMMARY

One or more embodiments of the present invention provide a method and apparatus for quantization encoding and de-quantization decoding using trellis.

According to an aspect of the present invention, there is provided a quantization encoding method comprising: detecting indexes corresponding to an input from a trellis coded quantization (TCQ) codebook; and entropy-encoding the detected indexes, wherein indexes are allocated in the TCQ codebook by classifying quantization levels to which cosets are allocated so that a coset corresponding to a specific branch can be selected in a predetermined state contained in a trellis by using only an index when de-quantization is performed.

According to another aspect of the present invention, there is provided a de-quantization decoding method comprising: restoring indexes by performing entropy-decoding; detecting cosets included in the restored indexes from a trellis coded quantization (TCQ) codebook; detecting a coset, which corresponds to a branch connecting between a current state and a subsequent state from among the detected cosets, from a trellis; and detecting a quantization level corresponding to the restored indexes and the detected coset from the TCQ codebook.

According to another aspect of the present invention, there is provided a method of forming a quantizer, the method comprising: setting cosets that are to be used in a trellis and a trellis coded quantization (TCQ) codebook; grouping the set cosets with cosets that cannot coexist with cosets allocated to branches connected to predetermined states; and classifying and indexing quantization levels contained in the TCQ codebook by using the grouped cosets.

According to another aspect of the present invention, there is provided a quantization encoding apparatus comprising: an index detector detecting indexes corresponding to an input from a trellis coded quantization (TCQ) codebook; and an entropy encoder entropy-encoding the detected indexes, wherein indexes are allocated in the TCQ codebook by classifying quantization levels to which cosets are allocated so that a coset corresponding to a specific branch can be selected in a predetermined state contained in a trellis by using only an index when de-quantization is performed.

According to another aspect of the present invention, there is provided a de-quantization decoding apparatus comprising: an entropy decoder restoring indexes by performing entropy-decoding; a coset detector detecting cosets included in the restored indexes from a trellis coded quantization (TCQ) codebook; a path detector detecting a coset, which corresponds to a branch connecting between a current state and a subsequent state from among the detected cosets, from a trellis; and a quantization level detector detecting a quantization level corresponding to the restored indexes and the detected coset from the TCQ codebook.

According to another aspect of the present invention, there is provided an apparatus for forming a quantizer, the apparatus comprising: a coset setting unit setting cosets that are to be used in a trellis and a trellis coded quantization (TCQ) codebook; a coset configuration unit grouping the set cosets with cosets that cannot coexist with cosets allocated to branches connected to predetermined states; and an indexing unit classifying and indexing quantization levels contained in the TCQ codebook by using the grouped cosets.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF THE EMBODIMENTS

Figure 1:
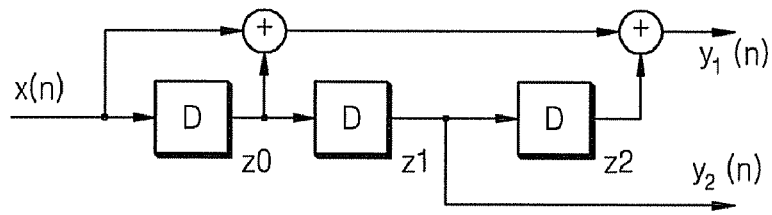
FIG. 1 illustrates a block diagram of a convolution encoder corresponding to an 8-state trellis using 4 cosets.

Reference will now be made in detail to embodiments, examples of which are illustrated in the accompanying drawings, wherein like reference numerals refer to the like elements throughout. In this regard, embodiments of the present invention may be embodied in many different forms and should not be construed as being limited to embodiments set forth herein. Accordingly, embodiments are merely described below, by referring to the figures, to explain aspects of the present invention.

According to the embodiments of a quantization encoding method and apparatus according to the present invention, quantization encoding can be implemented by using a convolution encoder, a trellis, and a trellis coded quantization (TCQ) codebook.

The convolution encoder receives a path and selects a branch from among branches connecting between a predetermined state contained in a predetermined stage and states contained in subsequent stages. FIG. 1 is a block diagram of a convolution encoder corresponding to an 8-state trellis using 4 cosets. Referring to FIG. 1, the convolution encoder receives '0' or '1', which is a code indicating a path, through an input terminal x(n), sequentially and temporarily stores codes z0, z1, and z2 indicating previous paths in "Ds", and outputs a code indicating a coset, which is an identifier allocated to each branch, through output terminals $y_1(n)$ and $y_2(n)$. For example, cosets corresponding to codes output through the output terminals $y_1(n)$ and $y_2(n)$ can be illustrated in Table 1.

TABLE 1

| y1 (n) | y2 (n) | Coset |
|---|---|---|
| 0 | 0 | $D_0$ |
| 0 | 1 | $D_1$ |
| 1 | 0 | $D_2$ |
| 1 | 1 | $D_3$ |

The convolution encoder corresponds to paths of states included in a trellis. The trellis includes a plurality of states, wherein each state contained in a predetermined stage is connected through branch(es) to at least one of a plurality of states contained in a subsequent stage, and each branch can be identified with a pre-set number of cosets.

Figure 2:
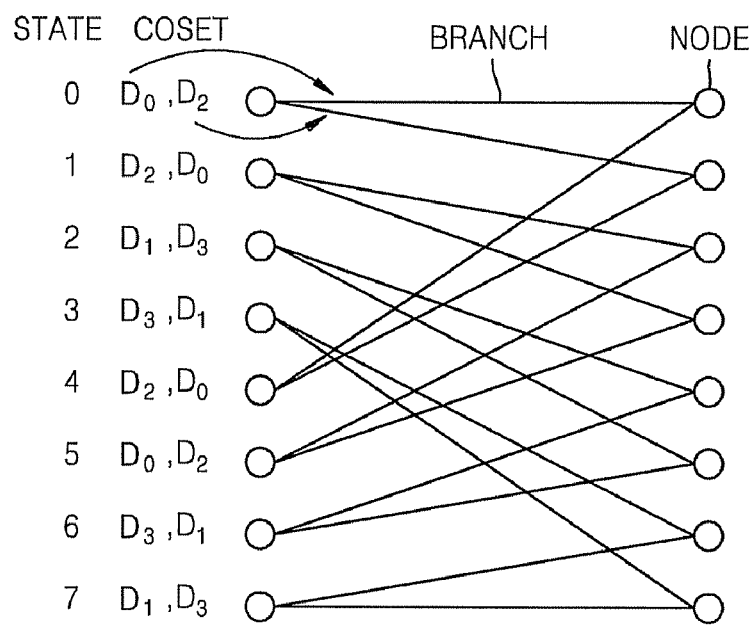
FIG. 2 illustrates a conceptual diagram of an 8-state trellis using 4 cosets.

For example, FIG. 2 is a conceptual diagram of an 8-state trellis using 4 cosets, which corresponds to the convolution encoder illustrated in FIG. 1. In FIG. 2, 0 through 7 correspond to 8 states, and $D_0$, $D_1$, $D_2$, and $D_3$ correspond to 4 cosets are allocated to respective branches. If a coset, i.e., the former of two cosets allocated to each state, is detected, a path of x(n) of the convolution encoder illustrated in FIG. 1 becomes '0', and the upper one of two branches connected to nodes of each state is selected as a path, and if a coset, i.e., the latter of two cosets allocated to each state, is detected, the path of x(n) of the convolution encoder illustrated in FIG. 1 becomes '1', and the lower one of two branches connected to nodes of each state is selected as a path. If a coset $D_0$ is detected in a state 4, $D_0$ corresponds to a coset in the latter, a lower branch is selected, and a code 1 indicating a path is selected.

Referring to FIGS. 1 and 2 and Table 1, when it is assumed that an initial state is '0', if codes '1', '1', '1', '1', and '0' indicating paths are sequentially input to the convolution encoder illustrated in FIG. 1 through the input terminal x(n), codes output from the convolution encoder illustrated in FIG. 1 through the output terminals $y_1(n)$ and $y_2(n)$, cosets illustrated in Table 1 corresponding to the codes, and states determined by the trellis illustrated in FIG. 2 according to the paths input through the input terminal x(n) are illustrated in Table 2.

TABLE 2

| x (n) | z2 | z1 | z0 | State | $y_1(n)$ | $y_2(n)$ | Coset |
|---|---|---|---|---|---|---|---|
| 1 | 0 | 0 | 0 | 0 | 1 | 0 | $D_2$ |
| 1 | 0 | 0 | 1 | 1 | 0 | 0 | $D_0$ |
| 1 | 0 | 1 | 1 | 3 | 0 | 1 | $D_1$ |
| 1 | 1 | 1 | 1 | 7 | 1 | 1 | $D_3$ |
| 0 | 1 | 1 | 1 | 7 | 0 | 1 | $D_1$ |

When it is assumed that '0' is initially allocated to z0, z1, and z2, if '1' is input through x(n) as a code indicating a path, by outputting '1' through $y_1(n)$ and '0' through $y_2(n)$ from the convolution encoder illustrated in FIG. 1, $D_2$ is selected as a coset corresponding to $y_1(n)$ and $y_2(n)$ from Table 1, and a branch corresponding to $D_2$ in the state 0 contained in the trellis illustrated in FIG. 2 is selected, and accordingly '1' is selected as a subsequent state. Thereafter, if '1' is input through x(n), '1' that is the previously input x(n) value is shifted to z0, '0' that is the value previously stored in z0 is shifted to z1, '0' that is the value previously stored in z1 is shifted to z2, and accordingly, by outputting '0' through $y_1(n)$ and '0' through $y_2(n)$ from the convolution encoder illustrated in FIG. 1, $D_0$ is selected as a coset corresponding to $y_1(n)$ and $y_2(n)$ from Table 1, and a branch corresponding to $D_0$ in the state 1 contained in the trellis illustrated in FIG. 2 is selected, and accordingly '3' is selected as a subsequent state. Likewise, if '1' is input through x(n) again, by outputting '0' through $y_1(n)$ and '1' through $y_2(n)$, $D_1$ is selected as a coset, and accordingly '7' is selected as a subsequent state. Thereafter, if '1' is input through x(n), by outputting '1' through $y_1(n)$ and '1' through $y_2(n)$, $D_3$ is selected as a coset, and accordingly '7' is selected as a subsequent state. Finally, if '0' is input through x(n), by outputting '0' through $y_1(n)$ and '1' through $y_2(n)$, $D_1$ is selected as a coset.

Cosets contained in the trellis illustrated in FIG. 2 are allocated to respective quantization levels contained in a TCQ codebook. The TCQ codebook can determine a quantization level corresponding to each input. In addition, in the TCQ codebook, quantization levels continuous in a predetermined unit are classified, and respective indexes are allocated to the classified quantization levels.

Figure 3:
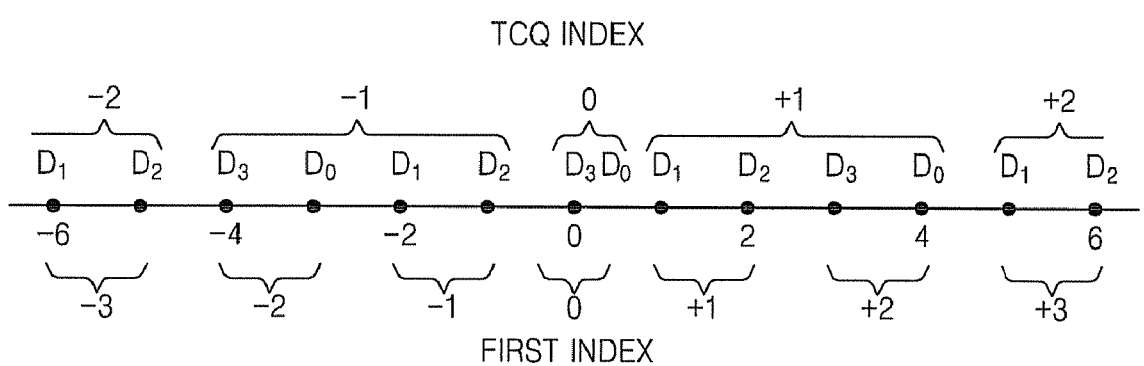
FIG. 3 illustrates a conceptual diagram of a 4-coset trellis coded quantization (TCQ) codebook.

For example, FIG. 3 is a conceptual diagram of a 4-coset TCQ codebook. According to a TCQ index illustrated in FIG. 3, a quantization level '0' to which the cosets $D_0$ and $D_3$ are allocated is classified as a TCQ index '0', a quantization level '−1.5' to which the coset $D_2$ is allocated, a quantization level '−2.5' to which the coset $D_1$ is allocated, a quantization level '−3.5' to which the coset $D_0$ is allocated, and a quantization level '−4.5' to which the coset $D_3$ is allocated are classified as a TCQ index '−1', and a quantization level '+1.5' to which the coset $D_1$ is allocated, a quantization level '+2.5' to which the coset $D_2$ is allocated, a quantization level '+3.5' to which the coset $D_3$ is allocated, and a quantization level '+4.5' to which the coset $D_0$ is allocated are classified as a TCQ index '+1'.

The TCQ codebook is pre-set so that different cosets are allocated to quantization levels contained in a single index excluding an index in which the quantization level '0' is included. In other words, the TCQ codebook classifies quantization levels by forming a single index with quantization levels corresponding to a total number of cosets. For example, if the total number of cosets is 4, the number of quantization levels contained in a single index is set to 4, and different cosets are allocated to the quantization levels. As described above, by allocating different cosets to quantization levels contained in a single index, each quantization level can be identified in a single index. From a TCQ codebook formed in this method, a TCQ index corresponding to an input is detected, a path corresponding to a quantization level is detected from a trellis and quantized, and entropy encoding of the detected TCQ index and path is performed.

However, if the entropy encoding of the detected TCQ index and path obtained in the method described above is performed, since the path varies randomly, it is inefficient in terms of entropy encoding. Thus, a new indexing method described below needs to be considered.

Figure 4:
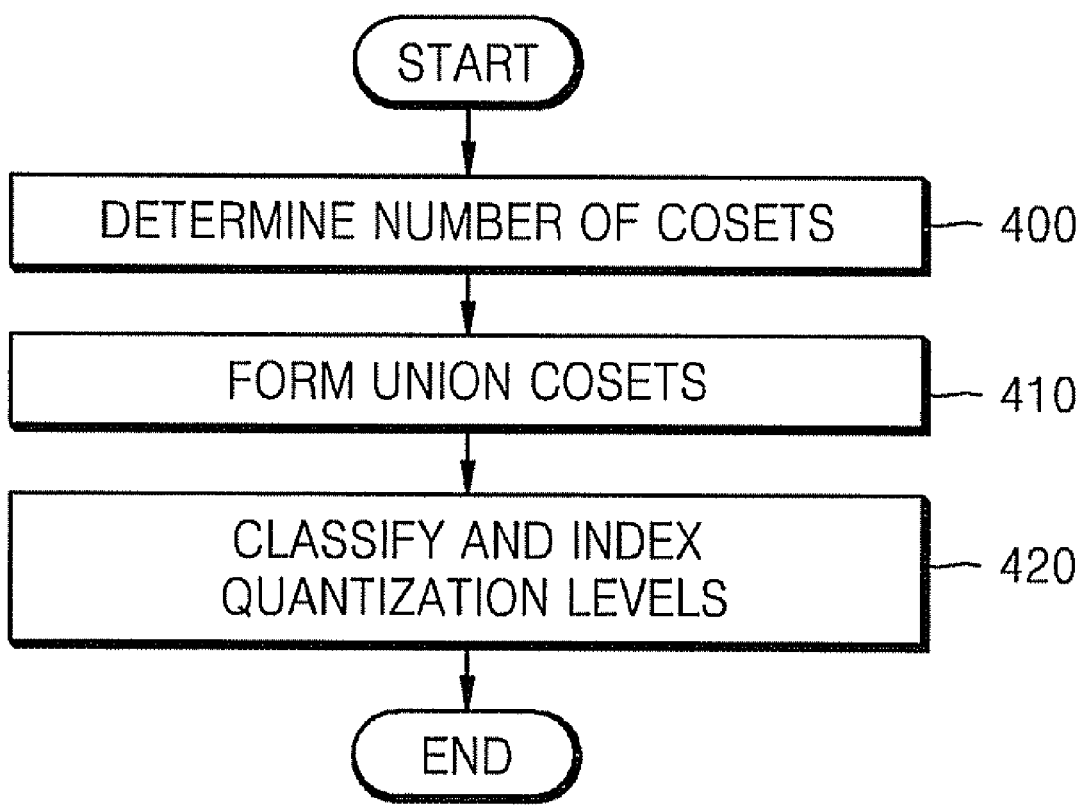
FIG. 4 illustrates a flowchart illustrating a method of forming a quantizer using a new indexing method, according to an embodiment of the present invention.

FIG. 4 is a flowchart illustrating a method of forming a quantizer using a new indexing method, according to an embodiment of the present invention.

Referring to FIG. 4, in operation 400, a total number of cosets to be used in a trellis and a TCQ codebook is determined and cosets corresponding to the total number of cosets are set. In operation 400, the total number of cosets can be determined as 2^n (n is an integer greater than 2). For example, if the total number of cosets is determined as 4, 4 cosets corresponding to $D_0$, $D_1$, $D_2$, and $D_3$ as illustrated in FIGS. 2 and 3 are set in the trellis and the TCQ codebook, and if the total number of cosets is determined as 8, 8 cosets corresponding to $D_0$, $D_1$, $D_2$, $D_3$, $D_4$, $D_5$, $D_6$, and $D_7$ are set in the trellis and the TCQ codebook.

In operation 410, union cosets are formed by using the cosets set in operation 400. The union cosets are formed with cosets that cannot coexist with cosets that are allocated to branches connected to nodes of predetermined states. In other words, cosets allocated to branches connected to a node of a predetermined state are not contained in the same union coset. Table 3 illustrates union cosets formed in a unit of 2 cosets.

TABLE 3

|  | First coset | Second coset |
| --- | --- | --- |
| First union coset | $D_0$ | $D_{K/2}$ |
| Second union coset | $D_{K/2}$ | $D_{(K/2)+1}$ |
| ... | ... | ... |
| $N^{th}$ union coset | $D_{(K/2)−1}$ | $D_{K−1}$ |

In Table 3, N is an integer greater than 2, and K is a total number of cosets. For example, the union cosets can be formed with {$D_0$-$D_2$, $D_1$-$D_3$} in a 4-coset TCQ codebook and formed with {$D_0$-$D_4$, $D_1$-$D_5$} and {$D_2$-$D_6$, $D_3$-$D_7$} in an 8-coset TCQ codebook.

In operation 420, quantization levels contained in the TCQ codebook are classified in a predetermined unit and indexed by using the union cosets formed in operation 410. When the indexing is performed in operation 420, quantization levels contained in a single index are indexed so that only cosets contained in another union coset are allocated to each quantization level. For example, in a 4-coset TCQ codebook in which union ocsets are formed with {$D_0$-$D_2$, $D_1$-$D_3$}, quantization levels corresponding to $D_0$ and $D_2$ contained in the same union coset must not be contained together in any index, and $D_1$ and $D_3$ as well.

The indexing method used in operation 420 includes a first indexing method and a second indexing method described below.

According to the first indexing method, in a first index, indexes corresponding to positive integers are allocated to quantization levels greater than '0', indexes corresponding to negative integers are allocated to quantization levels less than '0', and the indexes are allocated symmetrically on '0' so that absolute values of the indexes allocated to the quantization levels greater than '0' and the quantization levels less than '0' are the same with different signs.

For example, a first index is illustrated in the lower side of the 4-coset TCQ codebook illustrated in FIG. 3. In the first index, quantization levels greater than '0' are indexed as +1, +2, ..., +8, quantization levels less than '0' are indexed as −1, −2, ..., −8, and the indexes having the same absolute values with different signs are allocated symmetrically on '0'. In addition, quantization levels corresponding to $D_0$ and $D_2$ contained in the same union coset are not contained together in any index, and $D_1$ and $D_3$ as well. Thus, in the first index, a single index contains the number of quantization levels, which corresponds to a half as compared to the TCQ index as illustrated in FIG. 3.

By using the TCQ indexing method described above, the 4-coset TCQ codebook can be indexed in the first indexing method as represented by using Equation 1.

$$n_{D_0} = n_{D_3} = \begin{cases} 0 & \text{if } t = 0; \\ 2t & \text{if } t \neq 0; \end{cases}$$ (Equation 1)

$$n_{D_1} = n_{D_2} = \begin{cases} 2t - 1 & \text{if } t > 0; \\ 2t + 1 & \text{if } t < 0; \end{cases}$$

Here, n denotes the first index, and t denotes the TCQ index.

According to the second indexing method, in a second index, '0' is allocated to an index containing a smallest number of quantization levels by allocating only '0' and positive integers as indexes without allocating negative integers as indexes, and according to a sequential increase of quantization levels, by allocating indexes corresponding to a sequentially greater positive integer to the quantization levels, the indexes are allocated so that the biggest index is contained in an index containing the biggest quantization levels. Comparing the second indexing method to the first indexing method, the second indexing method has the same method of classifying quantization levels and the same sequence of sequentially indexing from the smallest quantization level to the biggest quantization level as the first indexing method. However, when indexes are allocated, in the first index, negative integers are allocated to indexes less than '0' and positive integers are allocated to indexes greater than '0' based on an index containing '0', and in the second index, '0' is allocated to an index containing the smallest quantization levels and positive integers are sequentially allocated to indexes till an index containing the biggest quantization levels.

For example, by using the TCQ indexing method described above, the 4-coset TCQ codebook can be indexed in the second indexing method as represented by using Equation 2.

$$n_{D_0} = \begin{cases} 0, & \text{if } t = 0; \\ 4t, & \text{if } t > 0; \\ -4t-1 & \text{if } t < 0; \end{cases}$$ (Equation 2)

$$n_{D_1} = \begin{cases} 4t-3 & \text{if } t > 0; \\ -4t-2 & \text{if } t < 0; \end{cases}$$

$$n_{D_2} = \begin{cases} 4t-2 & \text{if } t > 0; \\ -4t-3 & \text{if } t < 0; \end{cases}$$

$$n_{D_3} = \begin{cases} 0, & \text{if } t = 0; \\ 4t-1, & \text{if } t > 0; \\ -4t & \text{if } t < 0; \end{cases}$$

Here, n denotes the second index, and t denotes the TCQ index.

When the TCQ index, the first index, and the second index described above are applied to the 8-state trellis illustrated in FIG. 2 and the 4-coset TCQ codebook containing two zero levels, which is illustrated in FIG. 3, Tables 4 and 5 can be obtained. Table 4 illustrates indexes of a union coset $C_0$ formed with cosets $D_0$ and $D_2$, and Table 5 illustrates indexes of a union coset $C_1$ formed with cosets $D_1$ and $D_3$.

TABLE 4

| | Coset | | | | | | | | |
|---|---|---|---|---|---|---|---|---|---|
| | $D_0$ | $D_2$ | $D_2$ | $D_0$ | $D_0$ | $D_2$ | $D_2$ | $D_0$ | $D_0$ |
| $C_0 = D_0 \cup D_2$ quantization level | 0.5 | −1.5 | 2.5 | −3.5 | 4.5 | −5.5 | 6.5 | −7.5 | 8.5 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 5

| | Coset | | | | | | | | |
|---|---|---|---|---|---|---|---|---|---|
| | $D_3$ | $D_1$ | $D_1$ | $D_3$ | $D_3$ | $D_1$ | $D_1$ | $D_3$ | $D_3$ |
| $C_1 = D_1 \cup D_3$ quantization level | −0.5 | 1.5 | −2.5 | 3.5 | −4.5 | 5.5 | −6.5 | 7.5 | −8.5 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

In addition, when the TCQ index, the first index, and the second index are applied to an 8-coset TCQ codebook in which no zero level exists, Tables 6 through 9 can be obtained. Table 6 illustrates indexes of a union coset $A_0$ formed with cosets $D_0$ and $D_4$, Table 7 illustrates indexes of a union coset $A_1$ formed with cosets $D_1$ and $D_5$, Table 8 illustrates indexes of a union coset $A_2$ formed with cosets $D_2$ and $D_6$, and Table 9 illustrates indexes of a union coset $A_3$ formed with cosets $D_3$ and $D_7$.

TABLE 6

| | Coset | | | | | | | | |
|---|---|---|---|---|---|---|---|---|---|
| | $D_0$ | $D_4$ | $D_4$ | $D_0$ | $D_0$ | $D_4$ | $D_4$ | $D_0$ | $D_0$ |
| $A_0 = D_0 \cup D_4$ quantization level | 0.25 | −1.75 | 2.25 | −3.75 | 4.25 | −5.75 | 6.25 | −7.75 | 8.25 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 7

| | Coset | | | | | | | | |
|---|---|---|---|---|---|---|---|---|---|
| | $D_1$ | $D_5$ | $D_5$ | $D_1$ | $D_1$ | $D_5$ | $D_5$ | $D_1$ | $D_1$ |
| $A_1 = D_1 \cup D_5$ quantization level | 0.75 | −1.25 | 2.75 | −3.25 | 4.75 | −5.25 | 6.75 | −7.25 | 8.75 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 8

| | Coset | | | | | | | | |
|---|---|---|---|---|---|---|---|---|---|
| | $D_6$ | $D_2$ | $D_2$ | $D_6$ | $D_6$ | $D_2$ | $D_2$ | $D_6$ | $D_6$ |
| $A_2 = D_2 \cup D_6$ quantization level | −0.75 | 1.25 | −2.75 | 3.25 | −4.75 | 5.25 | −6.75 | 7.25 | −8.75 |
| TCQ index | 0 | +1 | −1 | +1 | −1 | +2 | −2 | +2 | −2 |
| First index | 0 | +1 | −1 | +2 | −2 | +3 | −3 | +4 | −4 |

TABLE 8-continued

|  | Coset | | | | | | | | |
| --- | --- | --- | --- | --- | --- | --- | --- | --- | --- |
|  | $D_6$ | $D_2$ | $D_2$ | $D_6$ | $D_6$ | $D_2$ | $D_2$ | $D_6$ | $D_6$ |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 9

|  | Coset | | | | | | | | |
| --- | --- | --- | --- | --- | --- | --- | --- | --- | --- |
|  | $D_7$ | $D_3$ | $D_3$ | $D_7$ | $D_7$ | $D_3$ | $D_3$ | $D_7$ | $D_7$ |
| $A_3 = D_3 \cup D_7$ quantization level | −0.25 | 1.75 | −2.25 | 3.75 | −4.25 | 5.75 | −6.25 | 7.75 | −8.25 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

Finally, when the TCQ index, the first index, and the second index are applied to an 8-coset TCQ codebook in which two zero levels exist, Tables 10 through 13 can be obtained. Table 10 illustrates indexes of a union coset $A_0$ formed with cosets $D_0$ and $D_4$, Table 11 illustrates indexes of a union coset $A_1$ formed with cosets $D_1$ and $D_5$, Table 12 illustrates indexes of a union coset $A_2$ formed with cosets $D_2$ and $D_6$, and Table 13 illustrates indexes of a union coset $A_3$ formed with cosets $D_3$ and $D_7$.

TABLE 10

|  | Coset | | | | | | | | |
| --- | --- | --- | --- | --- | --- | --- | --- | --- | --- |
|  | $D_0$ | $D_4$ | $D_4$ | $D_0$ | $D_0$ | $D_4$ | $D_4$ | $D_0$ | $D_0$ |
| $A_0 = D_0 \cup D_4$ quantization level | 0 | −1.5 | 2 | −3.5 | 4 | −5.5 | 6 | −7.5 | 8 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 11

|  | Coset | | | | | | | | |
| --- | --- | --- | --- | --- | --- | --- | --- | --- | --- |
|  | $D_1$ | $D_5$ | $D_5$ | $D_1$ | $D_1$ | $D_5$ | $D_5$ | $D_1$ | $D_1$ |
| $A_1 = D_1 \cup D_5$ quantization level | 0.5 | −1 | 2.5 | −3 | 4.5 | −5 | 6.5 | −7.5 | 8.5 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Coset Flag | 0 | 1 | 1 | 0 | 0 | 1 | 1 | 0 | 0 |

TABLE 12

|  | Coset | | | | | | | | |
| --- | --- | --- | --- | --- | --- | --- | --- | --- | --- |
|  | $D_6$ | $D_2$ | $D_2$ | $D_6$ | $D_6$ | $D_2$ | $D_2$ | $D_6$ | $D_6$ |
| $A_2 = D_2 \cup D_6$ quantization level | −0.5 | 1 | −2.5 | 3 | −4.5 | 5 | −6.5 | 7 | −8.5 |
| TCQ index | 0 | +1 | −1 | +1 | −1 | +2 | −2 | +2 | −2 |
| First index | 0 | +1 | −1 | +2 | −2 | +3 | −3 | +4 | −4 |

TABLE 12-continued

|  | Coset | | | | | | | | |
| --- | --- | --- | --- | --- | --- | --- | --- | --- | --- |
|  | $D_6$ | $D_2$ | $D_2$ | $D_6$ | $D_6$ | $D_2$ | $D_2$ | $D_6$ | $D_6$ |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 13

|  | Coset | | | | | | | | |
| --- | --- | --- | --- | --- | --- | --- | --- | --- | --- |
|  | $D_7$ | $D_3$ | $D_3$ | $D_7$ | $D_7$ | $D_3$ | $D_3$ | $D_7$ | $D_7$ |
| $A_3 = D_3 \cup D_7$ quantization level | 0 | 1.5 | −2 | 3.5 | −4 | 5.5 | −6 | 7.5 | −8 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

As described above, when the indexing is performed in the first indexing method and the second indexing method, an index containing the quantization level '0' is differently indexed from indexes containing quantization levels excluding '0'. The index containing the quantization level '0' can be classified into "two zero level" in which two cosets are allocated to the quantization level '0', "no zero level" in which no coset is allocated to the quantization level '0', and "dead-zone" in which the quantization level '0' is defined as a dead-zone.

Figure 5:
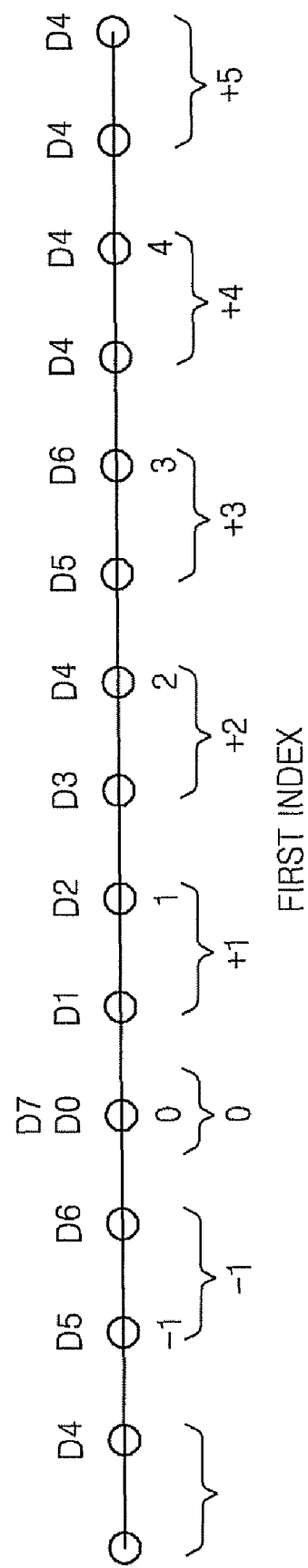
FIG. 5 illustrates a conceptual diagram of an 8-coset TCQ codebook.
Figure 6:
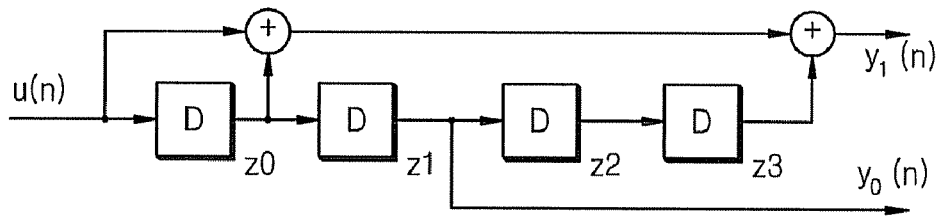
FIG. 6 illustrates a block diagram of a convolution encoder corresponding to a 16-state trellis using 4 cosets.
Figure 7:
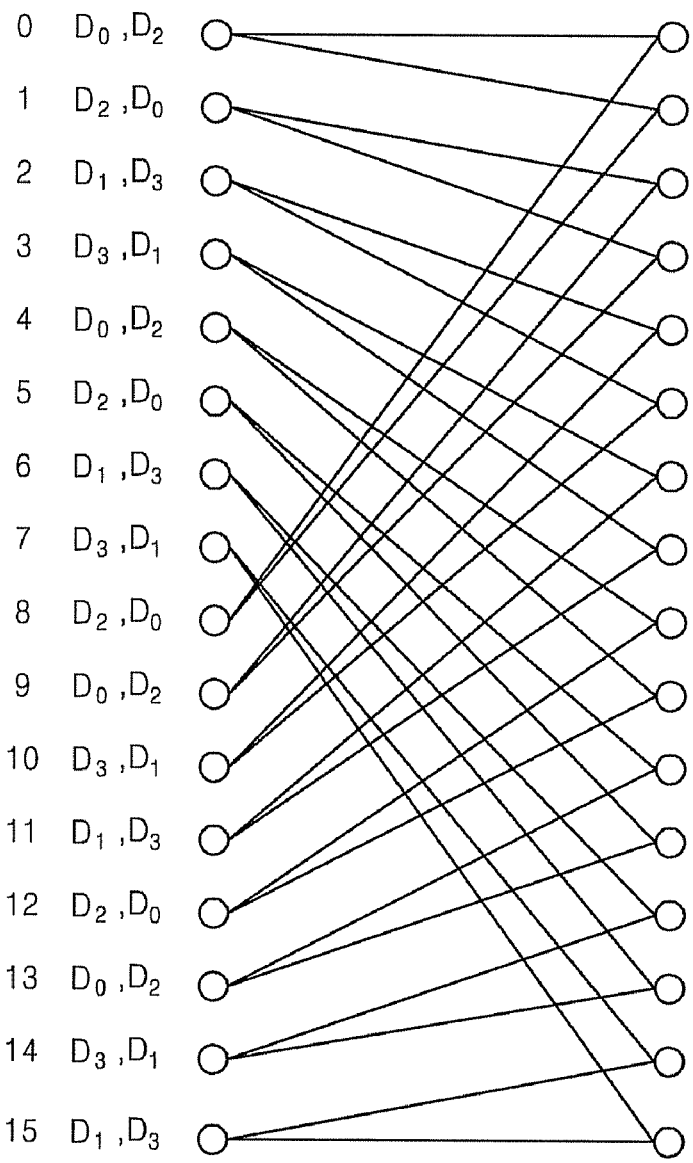
FIG. 7 illustrates a conceptual diagram of a 16-state trellis using 8 cosets.
Figure 8:
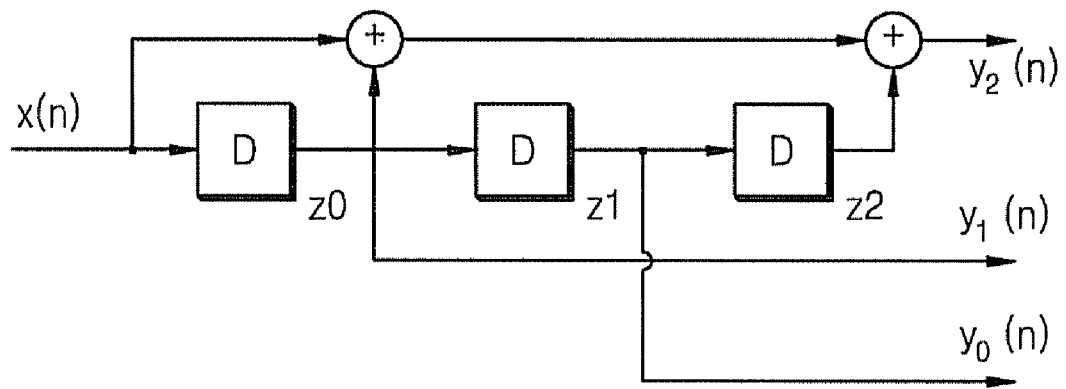
FIG. 8 illustrates a block diagram of a convolution encoder corresponding to a 8-state trellis using 8 cosets.
Figure 9:
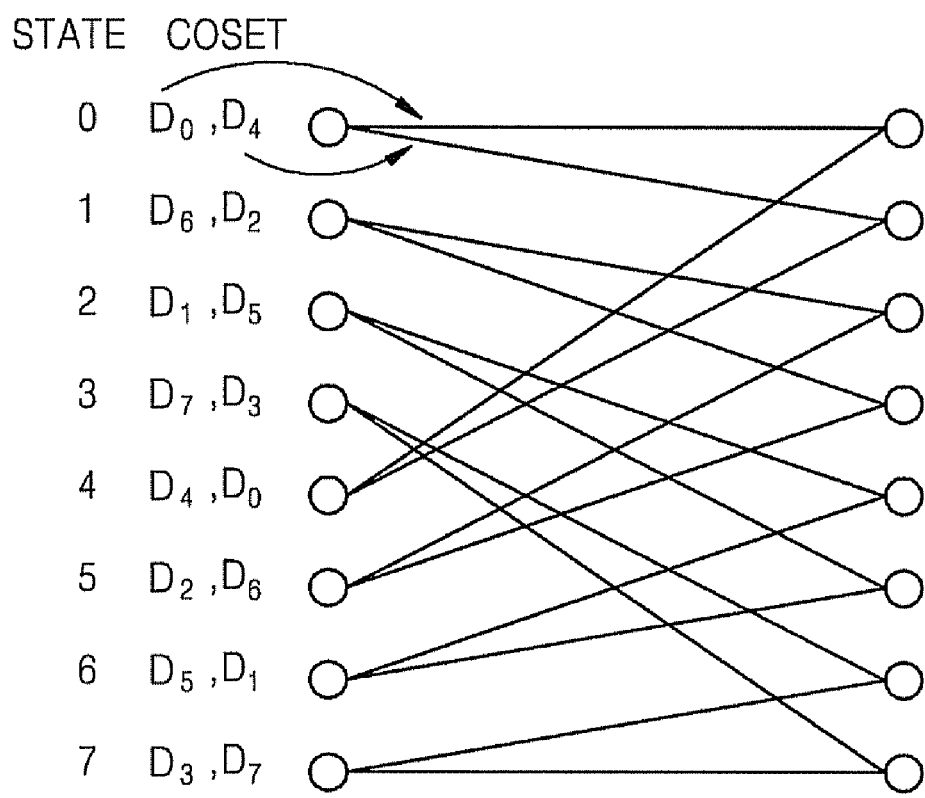
FIG. 9 illustrates a conceptual diagram of an 8-state trellis.
Figure 10:
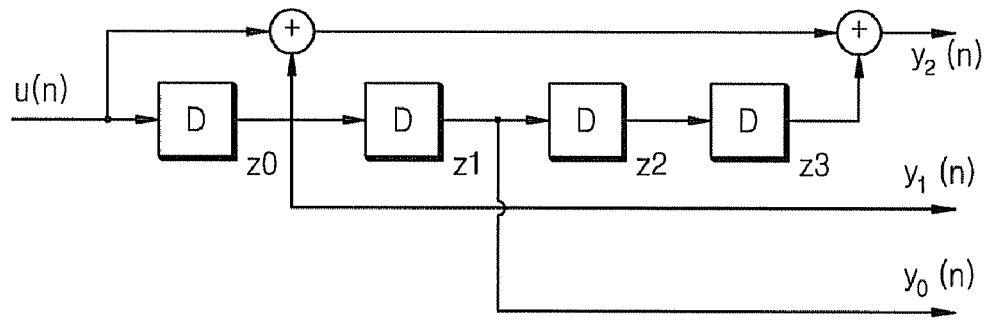
FIG. 10 illustrates a block diagram of a convolution encoder corresponding to a 16-state trellis using 8 cosets.
Figure 11:
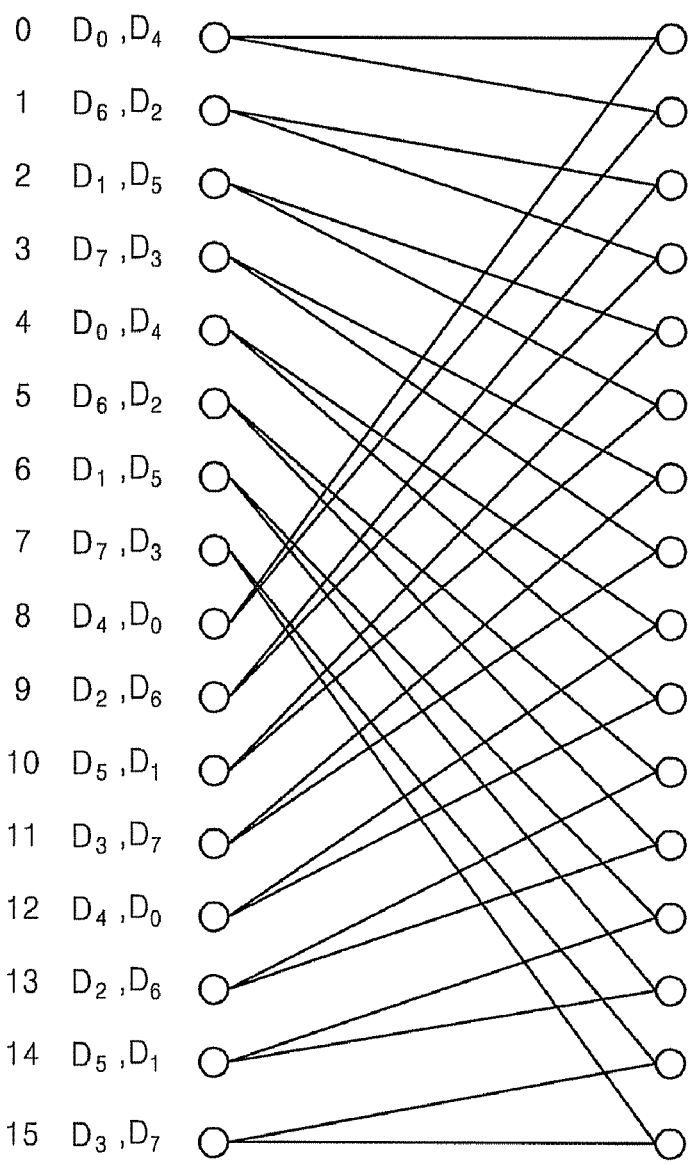
FIG. 11 illustrates a conceptual diagram of a 16-state trellis using 4 cosets.

First, as embodiments of a TCQ codebook in which two cosets are allocated to the quantization level '0', the 4-coset TCQ codebook is illustrated in FIG. 3, and the 8-coset TCQ codebook is illustrated in FIG. 5. The 4-coset TCQ codebook illustrated in FIG. 3 can be implemented by using the convolution encoder of an 8-state trellis code using 4 cosets, which is illustrated in FIG. 1, and the 8-state trellis illustrated in FIG. 2, or a convolution encoder of a 16-state trellis code using 4 cosets, which is illustrated in FIG. 6, and a 16-state trellis illustrated in FIG. 7. The 8-coset TCQ codebook illustrated in FIG. 5 can be implemented by using a convolution encoder of an 8-state trellis code using 8 cosets, which is illustrated in FIG. 8, and an 8-state trellis illustrated in FIG. 9, or a convolution encoder of a 16-state trellis code using 8 cosets, which is illustrated in FIG. 10, and a 16-state trellis illustrated in FIG. 11.

Figure 12:
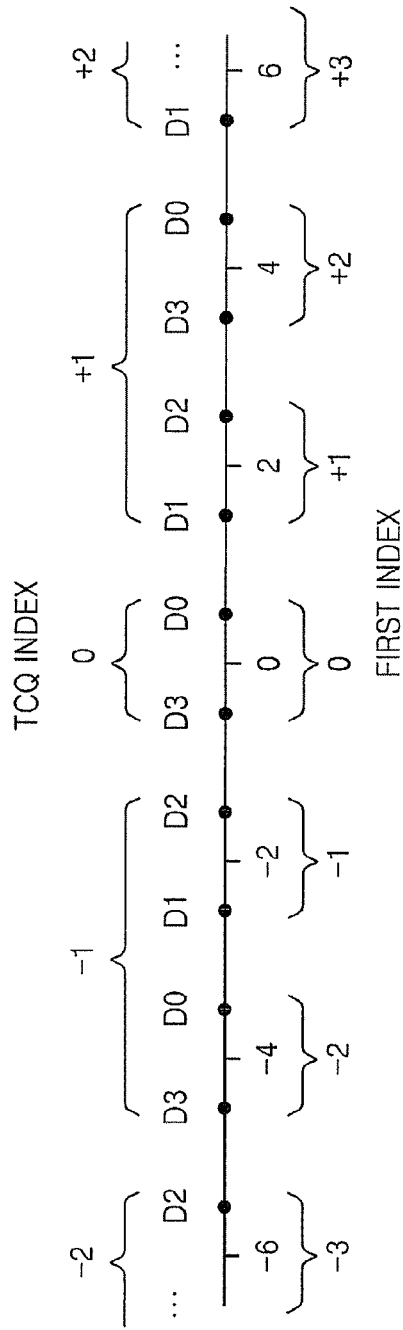
FIG. 12 illustrates a conceptual diagram of a 4-coset TCQ codebook in which a quantization level is not allocated to '0'.
Figure 13:
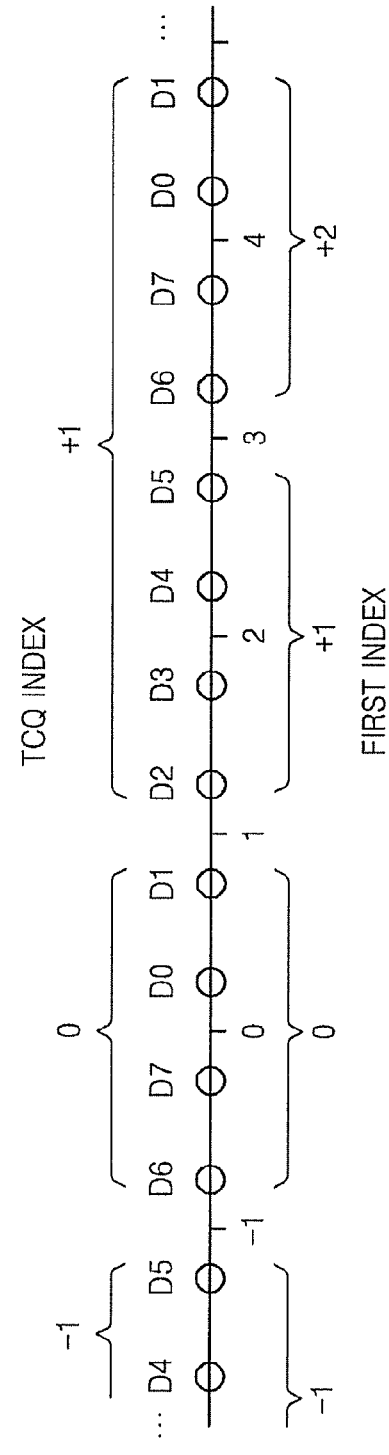
FIG. 13 illustrates a conceptual diagram of an 8-coset TCQ codebook in which a quantization level is not allocated to '0'.

Second, as embodiments of a TCQ codebook in which no coset is allocated to the quantization level '0', a 4-coset TCQ codebook is illustrated in FIG. 12, and an 8-coset TCQ codebook is illustrated in FIG. 13. The 4-coset TCQ codebook illustrated in FIG. 12 can be implemented by using the convolution encoder of an 8-state trellis code using 4 cosets, which is illustrated in FIG. 1, and the 8-state trellis illustrated in FIG. 2, or a convolution encoder of a 16-state trellis code using 4 cosets, which is illustrated in FIG. 6, and a 16-state trellis illustrated in FIG. 7. The 8-coset TCQ codebook illustrated in FIG. 13 can be implemented by using a convolution encoder of an 8-state trellis code using 8 cosets, which is illustrated in FIG. 8, and an 8-state trellis illustrated in FIG. 9, or a convolution encoder of a 16-state trellis code using 8 cosets, which is illustrated in FIG. 10, and a 16-state trellis illustrated in FIG. 11.

Figure 14:
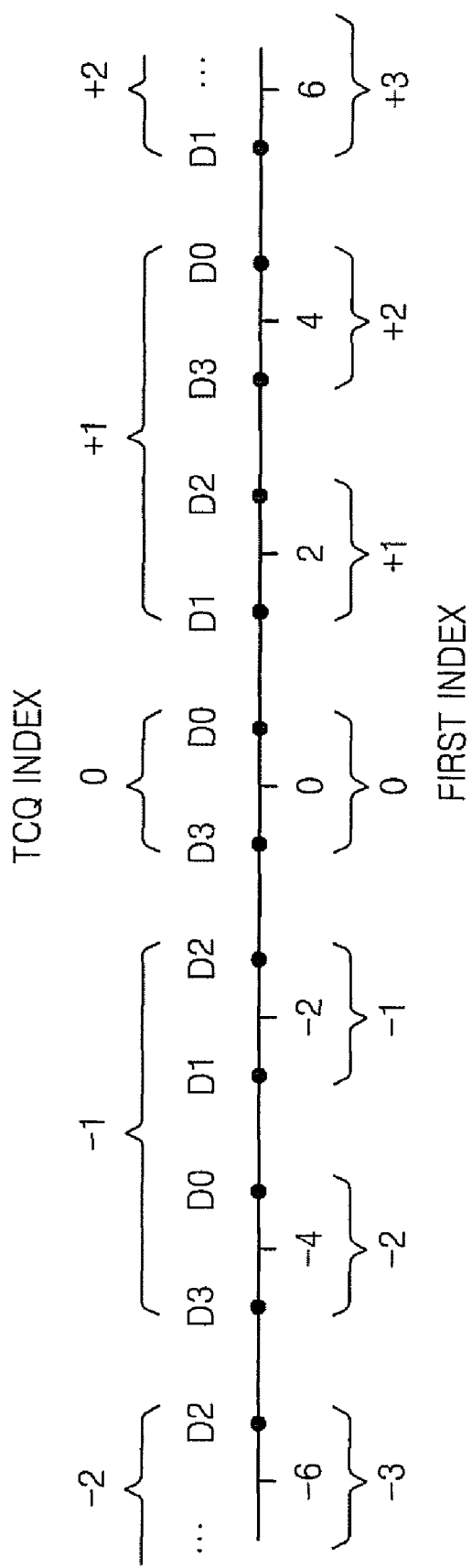
FIG. 14 illustrates a conceptual diagram of a 4-coset TCQ codebook in which a quantization level 0 is allocated as a dead zone.

Third, as embodiments of a TCQ codebook in which the quantization level '0' is defined as a dead-zone, a 4-coset TCQ codebook is illustrated in FIG. 14. The 4-coset TCQ codebook illustrated in FIG. 14 can be implemented by using the convolution encoder of an 8-state trellis code using 4 cosets, which is illustrated in FIG. 1, and the 8-state trellis illustrated in FIG. 2, or a convolution encoder of a 16-state trellis code using 4 cosets, which is illustrated in FIG. 6, and a 16-state trellis illustrated in FIG. 7.

Figure 15:
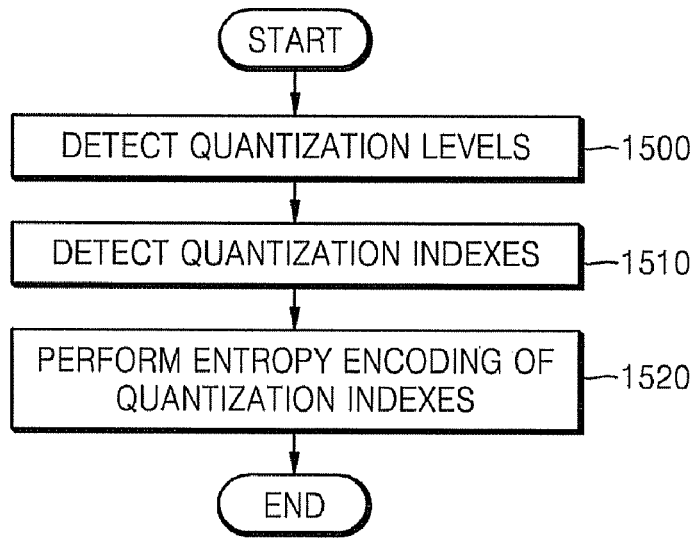
FIG. 15 illustrates a flowchart illustrating a quantization encoding method according to an embodiment of the present invention.

FIG. 15 is a flowchart illustrating a quantization encoding method according to an embodiment of the present invention.

Referring to FIG. 15, in operation 1500, quantization levels of input values are detected from a TCQ codebook. For example, it is assumed that quantization is performed by means of the first index by using the convolution encoder illustrated in FIG. 1, the trellis illustrated in FIG. 2, and the TCQ codebook illustrated in FIG. 12, in operation 1500, when (0.6, −5.1, 0.1, 1.3, −0.9, 5.8, 7.1, −1.1) are input, quantization levels (0.5, -5.5, 0.5, 1.5, -0.5, 5.5, 7.5, -1.5) corresponding to the respective input values are detected from the TCQ codebook illustrated in FIG. 12.

In operation 1510, indexes containing the quantization levels detected in operation 1500 are detected from the TCQ codebook. The indexes detected in operation 1510 correspond to the first index or the second index described above. In more detail, in operation 1510, the first index (0, −3, 0, +1, 0, +3, +4, +4, −1) containing the quantization levels (0.5, −5.5, 0.5, 1.5, −0.5, 5.5, 7.5, −1.5) detected in operation 1500 are detected from the TCQ codebook illustrated in FIG. 12. When this result is represented with bit-plane, Table 14 can be obtained.

TABLE 14

| | First index | | | | | | | |
|---|---|---|---|---|---|---|---|---|
| | 0 | −3 | 0 | +1 | 0 | +3 | +4 | −1 |
| $b_S$ | 0 | 1 | 0 | 0 | 0 | 0 | 0 | 1 |
| $b_2$ | 0 | 0 | 0 | 0 | 0 | 0 | 1 | 0 |
| $b_1$ | 0 | 1 | 0 | 0 | 0 | 1 | 0 | 0 |
| $b_0$ | 0 | 1 | 0 | 1 | 0 | 1 | 0 | 1 |

In operation 1520, entropy encoding of the indexes detected in operation 1510 are performed. Unlike that the TCQ index and information indicating a path are entropy-encoded together when the TCQ index is entropy-encoded, in operation 1520, only the first index or the second index is entropy-encoded without entropy encoding the information indicating a path.

Figure 16:
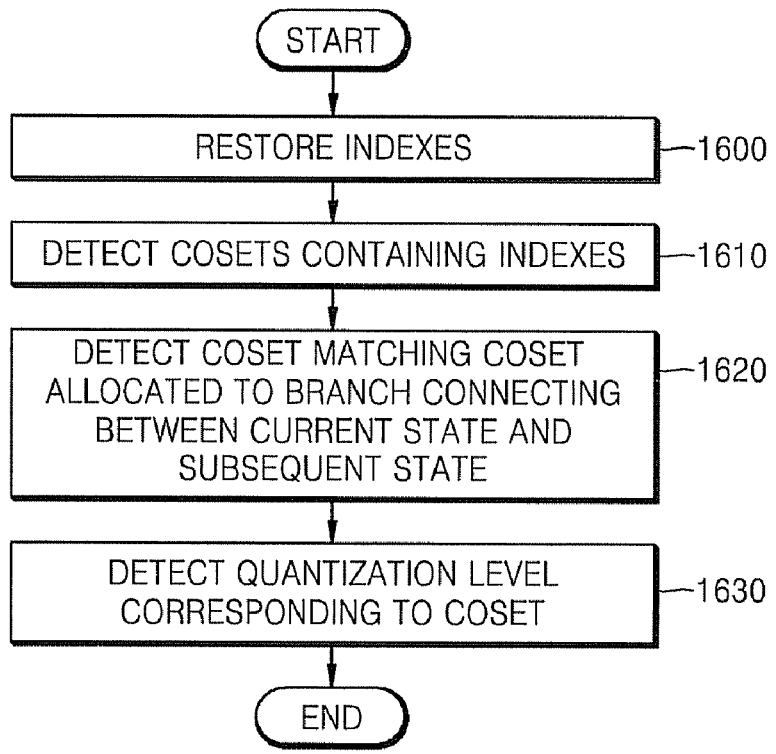
FIG. 16 illustrates a flowchart illustrating a de-quantization decoding method according to an embodiment of the present invention.

FIG. 16 is a flowchart illustrating a de-quantization decoding method according to an embodiment of the present invention.

Referring to FIG. 16, in operation 1600, indexes are restored by demultiplexing a bitstream received from an encoder and entropy-decoding the demultiplexed bitstream. The indexes restored in operation 1600 correspond to the first index or the second index.

In operation 1610, cosets contained in the indexes restored in operation 1600 are detected from the TCQ codebook.

In operation 1620, a coset, which matches a coset allocated to a branch connecting a current state and a subsequent state, is detected from among the cosets detected in operation 1610. A branch corresponding to the coset detected in operation 1620 is determined as a path, and a node connected to the branch becomes the subsequent state. Unlike the TCQ index, even if the information on the path is not input from the encoder in operation 1620, the path can be determined from the trellis because the first index or the second index is allocated by setting union cosets so that a specific branch can be selected in a predetermined state when quantization levels are indexed in the first index or the second index. In other words, in the first index or the second index, since the union cosets are formed with cosets that cannot coexist with cosets allocated to branches connected to a node of a predetermined state and the cosets allocated to branches connected to a node of a predetermined state are not contained in the same union coset, a decoder can detect the path without receiving the information on the path.

In operation 1630, de-quantization is performed by detecting a quantization level corresponding to the coset detected in operation 1620 from among the quantization levels contained in the indexes restored in operation 1610.

The flowchart of FIG. 16 will now be described in more detail with concrete examples. It is assumed that the quantization decoding is performed by using the convolution encoder corresponding to an 8-state trellis using 4 cosets, which is illustrated in FIG. 1, the 8-state trellis illustrated in FIG. 2, and the 4-coset TCQ codebook and the first index illustrated in FIG. 12. In addition, it is assumed that an initial state is set to '0' in the 8-state trellis illustrated in FIG. 2 and the indexes restored in operation 1600 are (0, −3, 0, +1).

First, for an index '0' of the first index, in operation 1610, the cosets $D_0$ and $D_3$ contained in the index '0' of the first index are detected from the 4-coset TCQ codebook illustrated in FIG. 12, and in operation 1620, the coset $D_0$, which is a coset matching the cosets $D_0$ and $D_2$ corresponding to the branches that can be selected in the initial state '0' of the 8-state trellis illustrated in FIG. 2, is selected from among the cosets $D_0$ and $D_3$ detected in operation 1610, and in operation 1630, de-quantization is performed by detecting a quantization level '0.5' corresponding to the coset $D_0$ contained in the index '0' of the first index. In addition, since the coset $D_0$ has been selected in operation 1620 from among the cosets $D_0$ and $D_2$ connected to the initial state '0', a branch corresponding to the coset $D_0$ in the state '0' is the upper branch, and therefore, a subsequent state becomes '0'.

Second, for an index '−3' of the first index, in operation 1610, the cosets $D_1$ and $D_2$ contained in the index '−3' of the first index are detected from the 4-coset TCQ codebook illustrated in FIG. 12, and in operation 1620, the coset $D_2$, which is a coset matching the cosets $D_0$ and $D_2$ corresponding to the branches that can be selected in the state '0' of the 8-state trellis illustrated in FIG. 2, is selected from among the cosets $D_1$ and $D_2$ detected in operation 1610, and in operation 1630, de-quantization is performed by detecting a quantization level '−5.5' corresponding to the coset $D_2$ contained in the index '−3' of the first index. In addition, since the coset $D_2$ has been selected in operation 1620 from among the cosets $D_0$ and $D_2$ connected to the state '0', a branch corresponding to the coset $D_2$ in the state '0' is the lower branch, and therefore, a subsequent state becomes '1'.

Third, for an index '0' of the first index, in operation 1610, the cosets $D_0$ and $D_3$ contained in the index '0' of the first index are detected from the 4-coset TCQ codebook illustrated in FIG. 12, and in operation 1620, the coset $D_0$, which is a coset matching the cosets $D_2$ and $D_0$ corresponding to the branches that can be selected in the state '1' of the 8-state trellis illustrated in FIG. 2, is selected from among the cosets $D_0$ and $D_3$ detected in operation 1610, and in operation 1630, de-quantization is performed by detecting a quantization level '0.5' corresponding to the coset $D_0$ contained in the index '0' of the first index. In addition, since the coset $D_0$ has been selected in operation 1620 from among the cosets $D_2$ and $D_0$ connected to the state '1', a branch corresponding to the coset $D_0$ in the state '1' is the lower branch, and therefore, a subsequent state becomes '3'.

Fourth, for an index '+1' of the first index, in operation 1610, the cosets $D_1$ and $D_2$ contained in the index '−3' of the first index are detected from the 4-coset TCQ codebook illustrated in FIG. 12, and in operation 1620, the coset $D_1$, which is a coset matching the cosets $D_3$ and $D_1$ corresponding to the branches that can be selected in the state '3' of the 8-state trellis illustrated in FIG. 2, is selected from among the cosets $D_1$ and $D_2$ detected in operation 1610, and in operation 1630, de-quantization is performed by detecting a quantization level '1.5' corresponding to the coset $D_1$ contained in the index '+1' of the first index. In addition, since the coset $D_1$ has been selected in operation 1620 from among the cosets $D_3$ and $D_1$ connected to the state '3', a branch corresponding to the coset $D_1$ in the state '3' is the lower branch, and therefore, a subsequent state becomes '7'.

Figure 17:
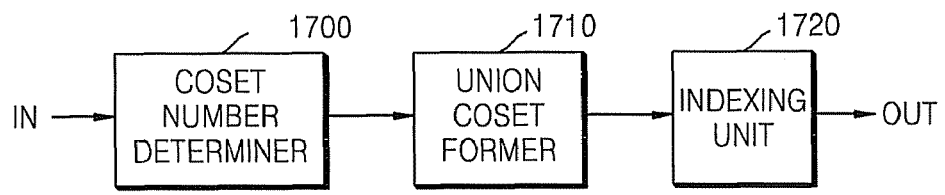
FIG. 17 illustrates a block diagram of an apparatus for forming a quantizer using a new indexing method, according to an embodiment of the present invention.

FIG. 17 is a block diagram of an apparatus for forming a quantizer using a new indexing method, according to an embodiment of the present invention. Referring to FIG. 17, the apparatus according to the current embodiment includes a coset number determiner 1700, a union coset former 1710, and an indexing unit 1720.

The coset number determiner 1700 determines a total number of cosets to be used in a trellis and a TCQ codebook and sets cosets according to the determined number. The coset number determiner 1700 can determine the total number of cosets as $2^n$ (n is an integer greater than 2). For example, if the total number of cosets is determined as 4, 4 cosets corresponding to $D_0$, $D_1$, $D_2$, and $D_3$ as illustrated in FIGS. 2 and 3 are set in the trellis and the TCQ codebook, and if the total number of cosets is determined as 8, 8 cosets corresponding to $D_0$, $D_1$, $D_2$, $D_3$, $D_4$, $D_5$, $D_6$, and $D_7$ are set in the trellis and the TCQ codebook.

The union coset former 1710 forms union cosets by using the cosets set by the coset number determiner 1700. The union cosets are formed with cosets that cannot coexist with cosets that are allocated to branches connected to nodes of predetermined states. In other words, cosets allocated to branches connected to a node of a predetermined state are not contained in the same union coset. Table 15 illustrates union cosets formed in a unit of 2 cosets.

TABLE 15

|  | First coset | Second coset |
|---|---|---|
| First union coset | $D_0$ | $D_{K/2}$ |
| Second union coset | $D_{K/2}$ | $D_{(K/2)+1}$ |
| ... | ... | ... |
| $N^{th}$ union coset | $D_{(K/2)-1}$ | $D_{K-1}$ |

In Table 3, N is an integer greater than 2, and K is a total number of cosets. For example, the union cosets can be formed with $\{D_0\text{-}D_2, D_1\text{-}D_3\}$ in a 4-coset TCQ codebook and formed with $\{D_0\text{-}D_4, D_1\text{-}D_5\}$ and $\{D_2\text{-}D_6, D_3\text{-}D_7\}$ in an 8-coset TCQ codebook.

The indexing unit 1720 performs indexing by classifying quantization levels contained in the TCQ codebook in a predetermined unit by using the union cosets formed by the union coset former 1710. When the indexing is performed by the indexing unit 1720, quantization levels contained in a single index are indexed so that only cosets contained in another union coset are allocated to each quantization level. For example, in a 4-coset TCQ codebook in which union ocsets are formed with $\{D_0\text{-}D_2, D_1\text{-}D_3\}$, quantization levels corresponding to $D_0$ and $D_2$ contained in the same union coset must not be contained together in any index, and $D_1$ and $D_3$ as well.

The indexing method used by the indexing unit 1720 includes a first indexing method and a second indexing method described below.

According to the first indexing method, in a first index, indexes corresponding to positive integers are allocated to quantization levels greater than '0', indexes corresponding to negative integers are allocated to quantization levels less than '0', and the indexes are allocated symmetrically on '0' so that absolute values of the indexes allocated to the quantization levels greater than '0' and the quantization levels less than '0' are the same with different signs.

For example, the first index is illustrated in the lower side of the 4-coset TCQ codebook illustrated in FIG. 3. In the first index, quantization levels greater than '0' are indexed as +1, +2, ..., +8, quantization levels less than '0' are indexed as −1, −2, ..., −8, and the indexes having the same absolute values with different signs are allocated symmetrically on '0'. In addition, quantization levels corresponding to $D_0$ and $D_2$ contained in the same union coset are not contained together in any index, and $D_1$ and $D_3$ as well. Thus, in the first index, a single index contains the number of quantization levels, which corresponds to a half as compared to the TCQ index as illustrated in FIG. 3.

By using the TCQ indexing method described above, the 4-coset TCQ codebook can be indexed in the first indexing method as represented by using Equation 3.

$$n_{D_0} = n_{D_3} = \begin{cases} 0 & \text{if } t = 0; \\ 2t & \text{if } t \neq 0; \end{cases}$$
$$n_{D_1} = n_{D_2} = \begin{cases} 2t-1 & \text{if } t > 0; \\ 2t+1 & \text{if } t < 0; \end{cases}$$
(Equation 3)

Here, n denotes the first index, and t denotes the TCQ index.

According to the second indexing method, in a second index, '0' is allocated to an index containing a smallest number of quantization levels by allocating only '0' and positive integers as indexes without allocating negative integers as indexes, and according to a sequential increase of quantization levels, by allocating indexes corresponding to a sequentially greater positive integer to the quantization levels, the indexes are allocated so that the biggest index is contained in an index containing the biggest quantization levels. Comparing the second indexing method to the first indexing method, the second indexing method has the same method of classifying quantization levels and the same sequence of sequentially indexing from the smallest quantization level to the biggest quantization level as the first indexing method. However, when indexes are allocated, in the first index, negative integers are allocated to indexes less than '0' and positive integers are allocated to indexes greater than '0' based on an index containing '0', and in the second index, '0' is allocated to an index containing the smallest quantization levels and positive integers are sequentially allocated to indexes till an index containing the biggest quantization levels.

For example, by using the TCQ indexing method described above, the 4-coset TCQ codebook can be indexed in the second indexing method as represented by using Equation 4.

$$n_{D_0} = \begin{cases} 0, & \text{if } t = 0; \\ 4t, & \text{if } t > 0; \\ -4t - 1 & \text{if } t < 0; \end{cases}$$ (Equation 4)

$$n_{D_1} = \begin{cases} 4t - 3 & \text{if } t > 0; \\ -4t - 2 & \text{if } t < 0; \end{cases}$$

$$n_{D_2} = \begin{cases} 4t - 2 & \text{if } t > 0; \\ -4t - 3 & \text{if } t < 0; \end{cases}$$

$$n_{D_3} = \begin{cases} 0, & \text{if } t = 0; \\ 4t - 1, & \text{if } t > 0; \\ -4t & \text{if } t < 0; \end{cases}$$

Here, n denotes the second index, and t denotes the TCQ index.

When the TCQ index, the first index, and the second index described above are applied to the 8-state trellis illustrated in FIG. 2 and the 4-coset TCQ codebook containing two zero levels, which is illustrated in FIG. 3, Tables 16 and 17 can be obtained. Table 16 illustrates indexes of a union coset $C_0$ formed with cosets $D_0$ and $D_2$, and Table 17 illustrates indexes of a union coset $C_1$ formed with cosets $D_1$ and $D_3$.

TABLE 16

| | Coset | | | | | | | | |
|---|---|---|---|---|---|---|---|---|---|
| | $D_0$ | $D_2$ | $D_2$ | $D_0$ | $D_0$ | $D_2$ | $D_2$ | $D_0$ | $D_0$ |
| $C_0 = D_0 \cup D_2$ quantization level | 0.5 | −1.5 | 2.5 | −3.5 | 4.5 | −5.5 | 6.5 | −7.5 | 8.5 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 17

| | Coset | | | | | | | | |
|---|---|---|---|---|---|---|---|---|---|
| | $D_3$ | $D_1$ | $D_1$ | $D_3$ | $D_3$ | $D_1$ | $D_1$ | $D_3$ | $D_3$ |
| $C_1 = D_1 \cup D_3$ quantization level | −0.5 | 1.5 | −2.5 | 3.5 | −4.5 | 5.5 | −6.5 | 7.5 | −8.5 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

In addition, when the TCQ index, the first index, and the second index are applied to an 8-coset TCQ codebook in which no zero level exists, Tables 18 through 21 can be obtained. Table 18 illustrates indexes of a union coset $A_0$ formed with cosets $D_0$ and $D_4$, Table 19 illustrates indexes of a union coset $A_1$ formed with cosets $D_1$ and $D_5$, Table 20 illustrates indexes of a union coset $A_2$ formed with cosets $D_2$ and $D_6$, and Table 21 illustrates indexes of a union coset $A_3$ formed with cosets $D_3$ and $D_7$.

TABLE 18

| | Coset | | | | | | | | |
|---|---|---|---|---|---|---|---|---|---|
| | $D_0$ | $D_4$ | $D_4$ | $D_0$ | $D_0$ | $D_4$ | $D_4$ | $D_0$ | $D_0$ |
| $A_0 = D_0 \cup D_4$ quantization level | 0.25 | −1.75 | 2.25 | −3.75 | 4.25 | −5.75 | 6.25 | −7.75 | 8.25 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 19

| | Coset | | | | | | | | |
|---|---|---|---|---|---|---|---|---|---|
| | $D_1$ | $D_5$ | $D_5$ | $D_1$ | $D_1$ | $D_5$ | $D_5$ | $D_1$ | $D_1$ |
| $A_1 = D_1 \cup D_5$ quantization level | 0.75 | −1.25 | 2.75 | −3.25 | 4.75 | −5.25 | 6.75 | −7.25 | 8.75 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 20

| | Coset | | | | | | | | |
|---|---|---|---|---|---|---|---|---|---|
| | $D_6$ | $D_2$ | $D_2$ | $D_6$ | $D_6$ | $D_2$ | $D_2$ | $D_6$ | $D_6$ |
| $A_2 = D_2 \cup D_6$ quantization level | −0.75 | 1.25 | −2.75 | 3.25 | −4.75 | 5.25 | −6.75 | 7.25 | −8.75 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 21

| | Coset | | | | | | | | |
|---|---|---|---|---|---|---|---|---|---|
| | $D_7$ | $D_3$ | $D_3$ | $D_7$ | $D_7$ | $D_3$ | $D_3$ | $D_7$ | $D_7$ |
| $A_3 = D_3 \cup D_7$ quantization level | −0.25 | 1.75 | −2.25 | 3.75 | −4.25 | 5.75 | −6.25 | 7.75 | −8.25 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

Finally, when the TCQ index, the first index, and the second index are applied to an 8-coset TCQ codebook in which two zero levels exist, Tables 22 through 25 can be obtained. Table 22 illustrates indexes of a union coset $A_0$ formed with cosets $D_0$ and $D_4$, Table 23 illustrates indexes of a union coset $A_1$ formed with cosets $D_1$ and $D_5$, Table 24 illustrates indexes of a union coset $A_2$ formed with cosets $D_2$ and $D_6$, and Table 25 illustrates indexes of a union coset $A_3$ formed with cosets $D_3$ and $D_7$.

TABLE 22

| | Coset | | | | | | | | |
|---|---|---|---|---|---|---|---|---|---|
| | $D_0$ | $D_4$ | $D_4$ | $D_0$ | $D_0$ | $D_4$ | $D_4$ | $D_0$ | $D_0$ |
| $A_0 = D_0 \cup D_4$ quantization level | 0 | −1.5 | 2 | −3.5 | 4 | −5.5 | 6 | −7.5 | 8 |
| TCQ index | 0 | −1 | +1 | −1 | +1 | −2 | +2 | −2 | +2 |
| First index | 0 | −1 | +1 | −2 | +2 | −3 | +3 | −4 | +4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 23

| | Coset | | | | | | | | |
|---|---|---|---|---|---|---|---|---|---|
| | $D_1$ | $D_5$ | $D_5$ | $D_1$ | $D_1$ | $D_5$ | $D_5$ | $D_1$ | $D_1$ |
| $A_1 = D_1 \cup D_5$ quantization level | 0.5 | −1 | 2.5 | −3 | 4.5 | −5 | 6.5 | −7.5 | 8.5 |
| TCQ index | 0 | −1 | +1 | −1 | +1 | −2 | +2 | −2 | +2 |

TABLE 23-continued

| | Coset | | | | | | | | |
|---|---|---|---|---|---|---|---|---|---|
| | $D_1$ | $D_5$ | $D_5$ | $D_1$ | $D_1$ | $D_5$ | $D_5$ | $D_1$ | $D_1$ |
| First index | 0 | −1 | +1 | −2 | +2 | −3 | +3 | −4 | +4 |
| Second index | 0 | 1 | 2 | 3 | 4 | 5 | 6 | 7 | 8 |
| Coset Flag | 0 | 1 | 1 | 0 | 0 | 1 | 1 | 0 | 0 |

TABLE 24

| | Coset | | | | | | | | |
|---|---|---|---|---|---|---|---|---|---|
| | $D_6$ | $D_2$ | $D_2$ | $D_6$ | $D_6$ | $D_2$ | $D_2$ | $D_6$ | $D_6$ |
| $A_2 = D_2 \cup D_6$ quantization level | −0.5 | 1 | −2.5 | 3 | −4.5 | 5 | −6.5 | 7 | −8.5 |
| TCQ index | 0 | +1 | −1 | +1 | −1 | +2 | −2 | +2 | −2 |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

TABLE 25

| | Coset | | | | | | | | |
|---|---|---|---|---|---|---|---|---|---|
| | $D_7$ | $D_3$ | $D_3$ | $D_7$ | $D_7$ | $D_3$ | $D_3$ | $D_7$ | $D_7$ |
| $A_3 = D_3 \cup D_7$ quantization level | 0 | 1.5 | −2 | 3.5 | −4 | 5.5 | −6 | 7.5 | −8 |
| TCQ index | 0 | +1 | −1 | +1 | −1 | +2 | −2 | +2 | −2 |

TABLE 25-continued

|  | Coset | | | | | | | | |
| --- | --- | --- | --- | --- | --- | --- | --- | --- | --- |
|  | $D_7$ | $D_3$ | $D_3$ | $D_7$ | $D_7$ | $D_3$ | $D_3$ | $D_7$ | $D_7$ |
| First index | 0 | +1 | −1 | +2 | −2 | +3 | −3 | +4 | −4 |
| Second index | 0 | 1 | 2 | 3 | 4 | 5 | 6 | 7 | 8 |
| Path | 0 | 1 | 1 | 0 | 0 | 1 | 1 | 0 | 0 |

Figure 18:
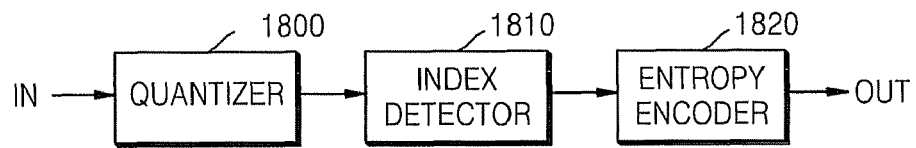
FIG. 18 illustrates a block diagram of a quantization encoding apparatus according to an embodiment of the present invention.

FIG. 18 is a block diagram of a quantization encoding apparatus according to an embodiment of the present invention. Referring to FIG. 18, the quantization encoding apparatus according to the current embodiment includes a quantizer 1800, an index detector 1810, and an entropy encoder 1820.

The quantizer 1800 detects quantization levels of values input through an input terminal IN from a TCQ codebook. For example, it is assumed that quantization is performed by means of the first index by using the convolution encoder illustrated in FIG. 1, the trellis illustrated in FIG. 2, and the TCQ codebook illustrated in FIG. 12, when (0.6, −5.1, 0.1, 1.3, −0.9, 5.8, 7.1, −1.1) are input to the quantizer 1800, the quantizer 1800 detects quantization levels (0.5, −5.5, 0.5, 1.5, −0.5, 5.5, 7.5, −1.5) corresponding to the respective input values from the TCQ codebook illustrated in FIG. 12.

The index detector 1810 detects indexes containing the quantization levels detected by the quantizer 1800 from the TCQ codebook. The indexes detected by the index detector 1810 correspond to the first index or the second index described above. In more detail, the index detector 1810 detects the first index (0, −3, 0, +1, 0, +3, +4, +4, −1) containing the quantization levels (0.5, −5.5, 0.5, 1.5, −0.5, 5.5, 7.5, −1.5) detected by the quantizer 1800 from the TCQ codebook illustrated in FIG. 12. When this result is represented with bit-plane, Table 26 can be obtained.

TABLE 26

|  | First index | | | | | | | |
| --- | --- | --- | --- | --- | --- | --- | --- | --- |
|  | 0 | −3 | 0 | +1 | 0 | +3 | +4 | −1 |
| $b_S$ | 0 | 1 | 0 | 0 | 0 | 0 | 0 | 1 |
| $b_2$ | 0 | 0 | 0 | 0 | 0 | 0 | 1 | 0 |
| $b_1$ | 0 | 1 | 0 | 0 | 0 | 1 | 0 | 0 |
| $b_0$ | 0 | 1 | 0 | 1 | 0 | 1 | 0 | 1 |

The entropy encoder 1820 performs entropy encoding of the indexes detected by the index detector 1810 and outputs the result through an output terminal OUT. Unlike that the TCQ index and information indicating a path are entropy-encoded together when the TCQ index is entropy-encoded, the entropy encoder 1820 performs entropy encoding of only the first index or the second index without entropy encoding the information indicating a path.

Figure 19:
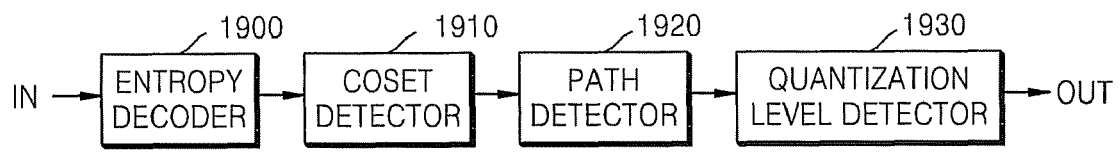
FIG. 19 illustrates a block diagram of a de-quantization decoding apparatus according to an embodiment of the present invention.

FIG. 19 is a block diagram of a de-quantization decoding apparatus according to an embodiment of the present invention. Referring to FIG. 19, the de-quantization decoding apparatus according to the current embodiment includes an entropy decoder 1900, a coset detector 1910, a path detector 1920, and a quantization level detector 1930.

The entropy decoder 1900 restores indexes by demultiplexing and entropy-decoding a bitstream received from an encoder through an input terminal IN. The indexes restored by the entropy decoder 1900 correspond to the first index or the second index.

The coset detector 1910 detects cosets contained in the indexes restored by the entropy decoder 1900 from the TCQ codebook.

The path detector 1920 detects a coset, which matches a coset allocated to a branch connecting a current state and a subsequent state, from among the cosets detected by the coset detector 1910. A branch corresponding to the coset detected by the path detector 1920 is determined as a path, and a node connected to the branch becomes the subsequent state. Unlike the TCQ index, even if the path detector 1920 has not received the information on the path from the encoder, the path can be determined from the trellis because the first index or the second index is allocated by setting union cosets so that a specific branch can be selected in a predetermined state when quantization levels are indexed in the first index or the second index. In other words, in the first index or the second index, since the union cosets are formed with cosets that cannot coexist with cosets allocated to branches connected to a node of a predetermined state and the cosets allocated to branches connected to a node of a predetermined state are not contained in the same union coset, a decoder can detect the path without receiving the information on the path.

The quantization level detector 1930 performs de-quantization by detecting a quantization level corresponding to the coset detected by the path detector 1920 from among the quantization levels contained in the indexes restored by the coset detector 1910 and outputs the result through an output terminal OUT.

In addition to the above described embodiments, embodiments of the present invention can also be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as carrier waves, as well as through the Internet, for example. Thus, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

While aspects of the present invention has been particularly shown and described with reference to differing embodiments thereof, it should be understood that these exemplary embodiments should be considered in a descriptive sense only and not for purposes of limitation. Any narrowing or broadening of functionality or capability of an aspect in one embodiment should not considered as a respective broadening or narrowing of similar features in a different embodiment, i.e., descriptions of features or aspects within each embodiment should typically be considered as available for other similar features or aspects in the remaining embodiments.

Thus, although a few embodiments have been shown and described, it would be appreciated by those skilled in the art that changes may be made in these embodiments without departing from the principles and spirit of the invention, the scope of which is defined in the claims and their equivalents.

What is claimed is:

1. An encoding method comprising:
   quantizing an input by detecting indexes corresponding to the input from a trellis coded quantization (TCQ) codebook; and
   entropy-encoding the detected indexes,
   wherein indexes are allocated in the TCQ codebook by classifying quantization levels to which cosets are allocated so that a coset corresponding to a specific branch can be selected in a predetermined state contained in a trellis by using only an index when de-quantization is performed.

2. The encoding method of claim 1, wherein the TCQ codebook comprises branch information of a trellis state for selecting a predetermined coset and a quantization level allocated to the coset.

3. The encoding method of claim 1, wherein the indexes are indexed so that cosets corresponding to branches connected to a predetermined state in a trellis cannot coexist.

4. The encoding method of claim 3, wherein, for the indexes, positive integers are allocated to quantization levels greater than '0', negative integers are allocated to quantization levels less than '0', and the indexes are allocated symmetrically on '0' with only different signs.

5. The encoding method of claim 3, wherein, for the indexes, '0' is allocated to an index containing a smallest number of quantization levels by allocating only '0' and positive integers as indexes, and according to a sequential increase of quantization levels, a sequentially greater positive integer is allocated to the quantization levels.

6. The encoding method of claim 1, wherein the entropy-encoding comprises not entropy encoding information of paths of a trellis.

7. The encoding method of claim 6, wherein the indexes are indexed by using one of a two-zero-level structure, a no-zero-level structure, and a dead-zone structure.

8. A decoding method comprising:
   restoring indexes by performing entropy-decoding;
   detecting cosets included in the restored indexes from a trellis coded quantization (TCQ) codebook;
   detecting a coset, which corresponds to a branch connecting between a current state and a subsequent state from among the detected cosets, from a trellis; and
   detecting a quantization level corresponding to the restored indexes and the detected coset from the TCQ codebook,
   wherein the TCQ codebook comprises branch information of a trellis state for selecting a predetermined coset and a quantization level allocated to the coset.

9. The decoding method of claim 8, wherein the indexes are indexed so that cosets corresponding to branches connected to a predetermined state in the trellis cannot coexist.

10. The decoding method of claim 9, wherein, for the indexes, positive integers are allocated to quantization levels greater than '0', negative integers are allocated to quantization levels less than '0', and the indexes are allocated symmetrically on '0' with only different signs.

11. The decoding method of claim 9, wherein, for the indexes, '0' is allocated to an index containing a smallest number of quantization levels by allocating only '0' and positive integers as indexes, and according to a sequential increase of quantization levels, a sequentially greater positive integer is allocated to the quantization levels.

12. The decoding method of claim 8, wherein the indexes are indexed by using one of a two-zero-level structure, a no-zero-level structure, and a dead-zone structure.

13. A method of forming a quantizer, the method comprising:
   setting cosets that are to be used in a trellis and a trellis coded quantization (TCQ) codebook;
   grouping the set cosets with cosets that cannot coexist with cosets allocated to branches connected to predetermined states; and
   classifying and indexing quantization levels contained in the TCQ codebook by using the grouped cosets,
   wherein the TCQ codebook comprises branch information of a trellis state for selecting a predetermined coset and a quantization level allocated to the coset.

14. The method of claim 13, wherein the setting comprises setting a total number of cosets as $2^n$.

15. The method of claim 13, wherein the indexing comprises performing indexing by using one of a two-zero-level structure, a no-zero-level structure, and a dead-zone structure.

16. A method of forming a dequantizer, the method comprising:
   detecting cosets included in entropy-decoded indexes from a trellis coded quantization (TCQ) codebook;
   detecting a coset, which corresponds to a branch connecting between a current state and a subsequent state from among the detected cosets, from a trellis; and
   detecting a quantization level corresponding to the restored indexes and the detected coset from the TCQ codebook,
   wherein the TCQ codebook comprises branch information of a trellis state for selecting a predetermined coset and a quantization level allocated to the coset.

* * * * *

UNITED STATES PATENT AND TRADEMARK OFFICE
CERTIFICATE OF CORRECTION

PATENT NO. : 7,944,377 B2
APPLICATION NO. : 12/556874
DATED : May 17, 2011
INVENTOR(S) : Ho-sang Sung et al.

It is certified that error appears in the above-identified patent and that said Letters Patent is hereby corrected as shown below:

Column 22, Line 31, In Claim 14, delete "2"." and insert --$2^n$.--, therefor.

Signed and Sealed this
Third Day of January, 2012

David J. Kappos
*Director of the United States Patent and Trademark Office*